United States Patent
Ma et al.

(10) Patent No.: US 11,637,082 B2
(45) Date of Patent: Apr. 25, 2023

(54) UNIFORM PRESSURE GANG BONDING METHOD

(71) Applicant: eLux Inc., Vancouver, WA (US)

(72) Inventors: Wei-Yuan Ma, Taipei (TW); Jong-Jan Lee, Camas, WA (US)

(73) Assignee: eLux, Inc., Vancouver, WA (US)

( * ) Notice: Subject to any disclaimer, the term of this patent is extended or adjusted under 35 U.S.C. 154(b) by 11 days.

(21) Appl. No.: 17/467,533

(22) Filed: Sep. 7, 2021

(65) Prior Publication Data

US 2021/0398938 A1    Dec. 23, 2021

Related U.S. Application Data

(62) Division of application No. 16/218,656, filed on Dec. 13, 2018, now Pat. No. 11,152,328.

(51) Int. Cl.
*B23K 3/00* (2006.01)
*H01L 23/00* (2006.01)
*B23K 3/08* (2006.01)

(52) U.S. Cl.
CPC .............. *H01L 24/75* (2013.01); *H01L 24/73* (2013.01); *B23K 3/087* (2013.01); *H01L 24/13* (2013.01); *H01L 24/16* (2013.01); *H01L 24/32* (2013.01); *H01L 24/83* (2013.01); *H01L 24/94* (2013.01); *H01L 24/97* (2013.01); *H01L 2224/13101* (2013.01); *H01L 2224/16145* (2013.01); *H01L 2224/16225* (2013.01);
(Continued)

(58) Field of Classification Search
CPC ......... B23K 3/08; B23K 20/023; B23K 3/087
See application file for complete search history.

(56) References Cited

U.S. PATENT DOCUMENTS 5,682,675 A * 11/1997 Hirota ................ H01R 43/205
279/3
6,779,703 B2 * 8/2004 Matsumoto ............ B21D 22/10
228/8

(Continued)

OTHER PUBLICATIONS

2017 IEEE 67th Electronic Components and Technology Conference: study of C2W Bonding Using Cu Pillar with Side-wall Plated Solder.
(Continued)

*Primary Examiner* — Erin B Saad
(74) *Attorney, Agent, or Firm* — Law Office of Gerald Maliszewski; Gerald Maliszewski

(57) ABSTRACT

A uniform pressure gang bonding device and fabrication method are presented using an expandable upper chamber with an elastic surface. Typically, the elastic surface is an elastomer material having a Young's modulus in a range of 40 to 1000 kilo-Pascal (kPA). After depositing a plurality of components overlying a substrate top surface, the substrate is positioned over the lower plate, with the top surface underlying and adjacent (in close proximity) to the elastic surface. The method creates a positive upper chamber medium pressure differential in the expandable upper chamber, causing the elastic surface to deform. For example, the positive upper chamber medium pressure differential may be in the range of 0.05 atmospheres (atm) and 10 atm. Typically, the elastic surface deforms between 0.5 millimeters (mm) and 20 mm, in response to the positive upper chamber medium pressure differential.

21 Claims, 8 Drawing Sheets

(52) U.S. Cl.
CPC ............... *H01L 2224/32145* (2013.01); *H01L 2224/32225* (2013.01); *H01L 2224/73204* (2013.01); *H01L 2224/7598* (2013.01); *H01L 2224/75251* (2013.01); *H01L 2224/75252* (2013.01); *H01L 2224/75282* (2013.01); *H01L 2224/75704* (2013.01); *H01L 2224/81203* (2013.01); *H01L 2224/81815* (2013.01); *H01L 2224/83203* (2013.01)

(56) References Cited

U.S. PATENT DOCUMENTS

| | | | | |
|---|---|---|---|---|
| 8,833,418 | B2* | 9/2014 | Or | H01L 24/29 156/379.7 |
| 8,899,289 | B2* | 12/2014 | Deguchi | H01L 21/67126 438/455 |
| 8,978,960 | B2* | 3/2015 | Brofman | B23K 3/047 228/106 |
| 9,553,069 | B2* | 1/2017 | Han | B23K 37/04 |
| 9,948,051 | B2* | 4/2018 | Feng | B23K 3/08 |
| 9,956,643 | B2* | 5/2018 | Matsubayashi | B23K 1/0016 |
| 10,037,903 | B2* | 7/2018 | Matsubayashi | H01L 21/67092 |
| 10,083,844 | B2* | 9/2018 | Matsubayashi | H01L 24/75 |
| 2006/0030075 | A1* | 2/2006 | Sugiyama | H01L 24/29 257/E21.503 |
| 2007/0105459 | A1* | 5/2007 | Aruga | H01L 21/4835 257/E23.011 |
| 2010/0024667 | A1* | 2/2010 | Ikura | H01L 24/75 100/305 |
| 2012/0091187 | A1* | 4/2012 | Akiyama | H01L 21/67092 228/221 |
| 2012/0247664 | A1* | 10/2012 | Kobayashi | H01L 24/75 156/308.2 |
| 2014/0033518 | A1* | 2/2014 | Ito | H05K 3/305 29/739 |
| 2015/0053350 | A1* | 2/2015 | Han | H01L 25/0657 269/21 |
| 2015/0144683 | A1* | 5/2015 | Ootake | B23K 1/20 228/248.1 |
| 2016/0118362 | A1* | 4/2016 | Han | B23K 37/04 228/6.2 |
| 2017/0066075 | A1* | 3/2017 | Matsubayashi | B23K 1/0016 |
| 2020/0194401 | A1* | 6/2020 | Ma | B23K 3/08 |

OTHER PUBLICATIONS

6th Int'l Conference & Exhibit on Device Packaging: Die-to-Wafer bonding of thin dies using a 2-Step approach; High Accuracy Placement, then Gang Bonding.

International Journal of Mechanical Engineering and Robotics Research vol. 5, No. 4, Oct. 2016: A Novel Method of CoW Bonding for High Density Ultra-Fine Pitch IC Stacking.

http://electroiq.com/insights-from-leading-edge/2016/08/iftle-298-ime-., IFTLE 298 IME 20um Pitch Thermo Compression Copper Pillar Bonding.

* cited by examiner

UNIFORM PRESSURE GANG BONDING METHOD

RELATED APPLICATIONS

Any and all applications, if any, for which a foreign or domestic priority claim is identified in the Application Data Sheet of the present application are hereby incorporated by reference under 37 CFR 1.57.

BACKGROUND OF THE INVENTION

1. Field of the Invention

This invention generally relates to integrated circuit (IC) packaging fabrication and, more particularly, to a system and method for gang bonding electrical components to a substrate using uniform pressure.

2. Description of the Related Art

In recent years the continuation of Moore's law has been enabled in part through 3-D integration, with multiple IC chips being bonded together to form a functional stack within a limited footprint. Over decades of IC development many bonding techniques have been applied in various areas of microelectronics. Wafer-to-wafer bonding is simple and effective, but it imposes a serious limitation by requiring that chip dimensions are identical for all layers. Die-to-wafer or chip-to-wafer bonding is an attractive and promising method, in which chips from one wafer are diced and then joined to another chip. With this technique dissimilar technologies can be joined to produce integrated solutions with, for example, analog signal processing modules bonded to analog-to-digital (A/D) converters and digital logic for signal analysis. An additional benefit is that individual chips can be tested before bonding so only good dies are joined together in the so-called "Known Good Die" approach.

Similar approaches to device bonding can be applied to planar light source applications in the display industry such as emissive displays or backlight units (BLU) for liquid crystal displays (LCDs). The ongoing miniaturization of light emitting diodes (LEDs) with lateral dimensions and thicknesses down to 200 microns (μm) and below requires additional developments in chip handling, assembly, and high speed bonding, for the assembly of many (millions) of LEDs onto a substrate. In addition to the LEDs, a product substrate may also include control ICs, passive devices (resistors, capacitors, and inductors), and electrical routing that permits the control of the LED chips assembled and bonded to the substrate.

A color display is typically composed of pixels that emit light in three wavelength bands corresponding to the visible colors red, green, and blue (RGB), often referred to as an RGB display. There are several display types that produce the RGB images differently, such as liquid crystal displays and organic light emitting diode (OLED) displays. Another display technology is the micro-LED display, which uses micro-sized inorganic LEDs for the direct emission of light at the pixel level. The largest challenge for the fabrication of micro-LED displays is the placement of millions of micro-LEDs on the display substrate in precise positions to connect with the electrical interfaces and form an array of pixels. Common methods for placing micro-LEDs are similar to those used to manufacture printed circuit boards. Pick-and-place assembly uses an actuator to pick up micro-LEDs one-by-one from a supply substrate, and then position the devices on the display substrate in a serial fashion. Mass transfer methods use a secondary substrate as a stamp, which is populated with micro-LEDs, and the stamp then places a small array of micro-LEDs on the display substrate. The complexity and cost for both techniques increase rapidly as the size of devices decreases and pixel density increases. For a typical high definition television (HDTV) with 6.2 million subpixels spaced 200 microns apart, the pick-and-place assembly time can be several days. For 4K and 8K televisions the number of sub-pixels increases to 24.9 million and 99.5 million respectively, with a commensurate decrease in sub-pixel size, making conventional LED deposition (placement) techniques impractical.

An alternative technology for positioning micro-LEDs is fluidic assembly, which uses a fluid forcing mechanism to move micro-LEDs across the display substrate where they are captured and held in an array of trap sites with electrical interfaces. Because fluidic assembly is massively parallel, the method is both low cost and very fast with demonstrated assembly rates over 50 million devices an hour. Fluidic assembly uses micro-LEDs fabricated from conventional inorganic LED wafers. The devices developed for fluidic assembly use specific electrode geometries to match the substrate electrodes and a post (navigation keel) structure to ensure that the electrode is correctly oriented during the assembly process as described in U.S. Pat. No. 9,825,202.

FIG. 1 is a partial cross-sectional view of a surface mount emissive element (prior art, U.S. Pat. No. 9,825,202). The surface mount emissive element 100 has a first electrical contact (electrode) 102 formed on the emissive element "top" surface and connected to a corresponding well first electrical interface 104. A second electrical contact 105 is also formed on the emissive element top surface and connected to a corresponding well second electrical interface 106. Each well first electrical interface 104 is connected to trace 108 and each well second electrical interface 106 is connected to trace 110. The post or keel 112 is formed on the emissive element "bottom" surface 114.

FIG. 2 is a schematic view of an emission substrate enabled with a first plurality of active matrix (AM) drive circuits (prior art). A substrate with AM drive circuits features a matrix of column conductive traces 108 and row conductive traces 110 connected to LEDs, e.g., the surface mount LED of FIG. 1.

In an exemplary case, the fabrication of a microLED display has four distinct stages as follows:

1) Fabrication of the display substrate, which is commonly a very large sheet of glass with thin film transistors (TFTs) to control the intensity of micro-LED emission from each subpixel connected in an X-Y array as shown in FIG. 2. The substrate also has features (e.g., wells) for traping micro-LEDs in positions so that the array electrodes can be bonded to the micro-LED. The substrate electrodes are typically copper (Cu), gold (Au), titanium (Ti), molydbenum (Mo), or an indium/tin (In/Sn) solder alloy.

2) Fabrication of micro-LEDs with a shape suitable for fluidic assembly and electrodes suitable for bonding to the substrate. The electrode stack on the micro-LED must make a low barrier connection to the n and p-doped regions of the LED typically using nickle/indium-tin-oxide (Ni/ITO) for p-doped gallium nitride (p-GaN) and chromium (Cr) for n-doped GaN (n-GaN). Then, the top surface of the electrode is a solder layer with low melting temperature such as an In/Sn alloy.

3) Fluidic assembly of the micro-LEDs in all of the array positions with the orientation of the electrodes toward the bottom of the well.

4) A bonding process that forms a metal connection between each micro-LED electrodes and the substrate electrodes.

A common method to achieve chip-to-wafer or chip-to-substrate bonding is to use thermal compression bonding (TCB), where each chip is placed on the substrate and then bonded separately. TCB bonding with bump pitch of 50-100 microns (μm) takes 14-16 seconds per chip, which corresponds to more than 22 hours for a 300 millimeter (mm) wafer with 1440 dies×4 layer stacking.

To increase the throughput and decrease the cost, many collective bonding, group bonding, or gang bonding processes have been proposed. The basic idea is to have two steps in the bonding process: the first step is to pick-and-place chips onto the substrate and the second step is to perform group bonding so that the long bonding time is shared across many chips.

FIGS. 3A and 3B illustrate fabrication steps comparing conventional TCB bonding of FIG. 3A with 2-step gang bonding of FIG. 3B (prior art). For gang bonding, the pickup tool picks up chips from a wafer or tray and places them onto the product substrate that has an adhesive to hold the chip in place. At that moment the electrical connection between chips and the product substrate has not been established. After placing a group of chips onto the product substrate, pressure and heat are applied to the chips, bonding them to the product substrate group by group. As shown, a piston presses down on the chips with the product substrate placed on a heated surface maintained at 200-300° C. In some cases the pressure head is also heated.

A conventional gang bonder may use a planar metal piston to apply pressure to the top wafer in a bonding stack. In many cases, the chips may not have the same thickness, so an elastomer layer is added over the chips or on the surface of the pressure plate to absorb chip height variations and help equalize the down forces on each. This method works so long as the chips are thick enough to withstand the additional applied pressure. If chips have different thicknesses, the bonding of the thinner chips may be a challenge. When the metal piston pushes down, it applies pressure to the thickest chips first, and as the elastomer starts to deform, the piston can only continue its movement down by increasing the pressure. As a result, the increased pressure causes the thinner chips to become bonded. However, in some cases, the chips are too fragile to survive these high pressure levels. In the case of a micro-LED display, the LED thickness is in the range of 2 μm to 10 μm and these micro-LEDs (μLEDs) are very fragile, particular gallium arsenide (GaAs) based red LEDs. It is difficult to achieve uniform bonding in this case without breaking micro-LEDs using the elastomer method. Furthermore, the substrate and the pressure plate must remain parallel in order to provide uniform pressure across large areas. For display products the substrate is quite fragile and the size may be larger than 1 square meter ($m^2$), so it is difficult to maintain a uniform force across such a large substrate area. Of course, gang bonding can be done serially in many smaller groups with a commensurate increase in bonding time and cost.

FIG. 4 is a diagram depicting the application of uniform pressure onto chips with various thicknesses using hydrostatic pressure (prior art). In order to achieve a net force on the top surface, the bottom surface of the chip should not be exposed to the pressure medium, or the top surface area must be larger than the bottom surface area being exposed to the pressure medium. Although hydrostatic pressure does apply uniform pressure onto chips with various thicknesses, it is not a practical way to apply pressure for display fabrication and many other cases. In the case of μLED display fabrication, the substrate is glass and it is not possible to seal the well cavities under the LEDs to produce a net downward force for bonding.

It would be advantageous if a micro-LEDs fabrication method existed to bond electrical components with uniform pressure, regardless of differences in component topology, heights, and fragility, the number of components, and the surface area and topology of the substrate.

SUMMARY OF THE INVENTION

Disclosed herein is a gang bonding apparatus and fabrication method that applies a uniform and directional pressure onto electrical devices when thermally bonding the devices to electrical interfaces on a product substrate. Although this tool has particular application to the bonding of micro-light emitting diodes (μLEDs), it has broader application to 3D packages of semiconductor integrated circuits (ICs) or any electrical or mechanical component that can be bonded to a substrate, printed circuit board, or integrated circuit.

Accordingly, a uniform pressure gang bonding method is presented that provides a lower plate and an expandable upper chamber with an elastic surface. Typically, the elastic surface is an elastomer material having a Young's modulus in a range of 40 to 1000 kilo-Pascal (kPA). After depositing a plurality of components overlying a substrate top surface, the substrate is positioned over the lower plate, with the top surface underlying and adjacent (in close proximity) to the elastic surface. The method creates a positive upper chamber medium pressure differential in the expandable upper chamber, causing the elastic surface to deform. For example, the positive upper chamber medium pressure differential may be in the range of 0.5 atmospheres (atm) and 10 atm. Typically, the elastic surface deforms between 0.05 millimeters (mm) and 20 mm, in response to the positive upper chamber medium pressure differential.

In response to deforming the elastic surface, a uniform pressure is applied to the plurality of components. Simultaneous with applying the uniform pressure, the substrate may be heated, and in response to the uniform pressure and heat, the components are bonded to the substrate top surface. If the method deposits semiconductor devices with electrical contacts overlying corresponding electrical interfaces on the substrate top surface, then the semiconductor device electrical contacts are solder bonded to the substrate electrical interfaces.

In the case of the substrate top surface occupying an environment with an ambient atmospheric pressure, the creation of a positive upper chamber medium pressure differential means that the upper chamber medium pressure is greater than the ambient atmospheric pressure, which causes the elastic surface to deform in a direction towards the substrate top surface. Otherwise, the substrate top surface may occupy an ambient control lower chamber, with a seal formed (in part) by the elastic surface of the expandable upper chamber, or an environmental control lower chamber with an ambient atmospheric pressure but controlled type of gas (atmosphere) medium. In either case, the creation of the positive upper chamber medium pressure differential includes creating an upper chamber pressure greater than the pressure in the ambient or environmental control lower chamber. The ambient control lower chamber may use one of the following mediums to create pressure: a vacuum, partial vacuum, ambient air, an inert gas, a forming gas, formic acid, or combinations thereof. The gas medium types used in an environmental control lower chamber may be ambient air, an inert gas, a forming gas, formic acid, or a combination of these elements. A vacuum and inert gas ambient atmosphere prevents the oxidation of electrode metal surfaces, whereas a reduction ambient atmosphere using formic acid and forming gas can break off any electrode metal surface oxide and so facilitate bonding. The upper chamber medium may be either any type of gas or a liquid.

In one aspect, the method deposits first components having a first profile height as well as second components having a second profile height, different than the first profile height. The differences in profile heights may be the result of different component thicknesses or topologies, a non-planar substrate top surface, or a combination of these factors. However, the method is able to apply a uniform pressure on both the first and second components despite the profile height differences. More explicitly, the difference in pressure applied on the first and second components is less than or equal to 5 kPA for a difference in profile height of up to 100 microns.

Additional details of the above-described method, and uniform pressure gang bonding device are provided below.

DETAILED DESCRIPTION

Figure 1:
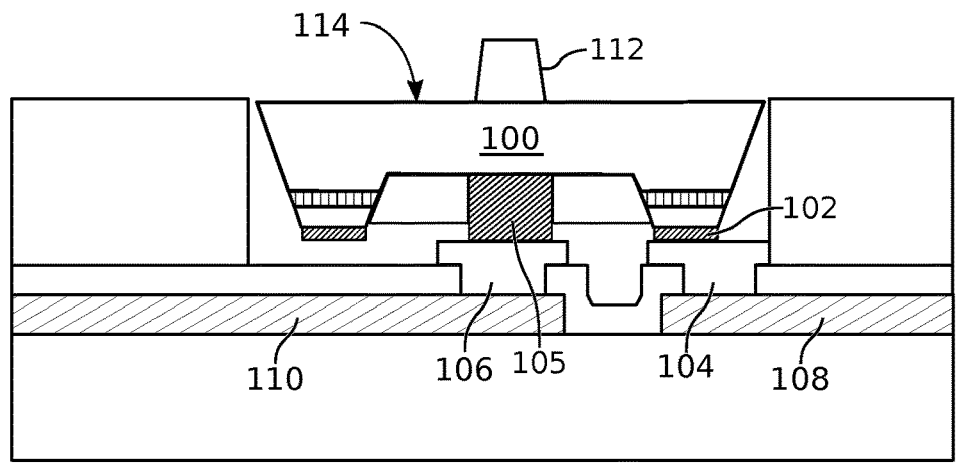
FIG. 1 is a partial cross-sectional view of a surface mount emissive element (prior art, U.S. Pat. No. 9,825,202).
Figure 2:
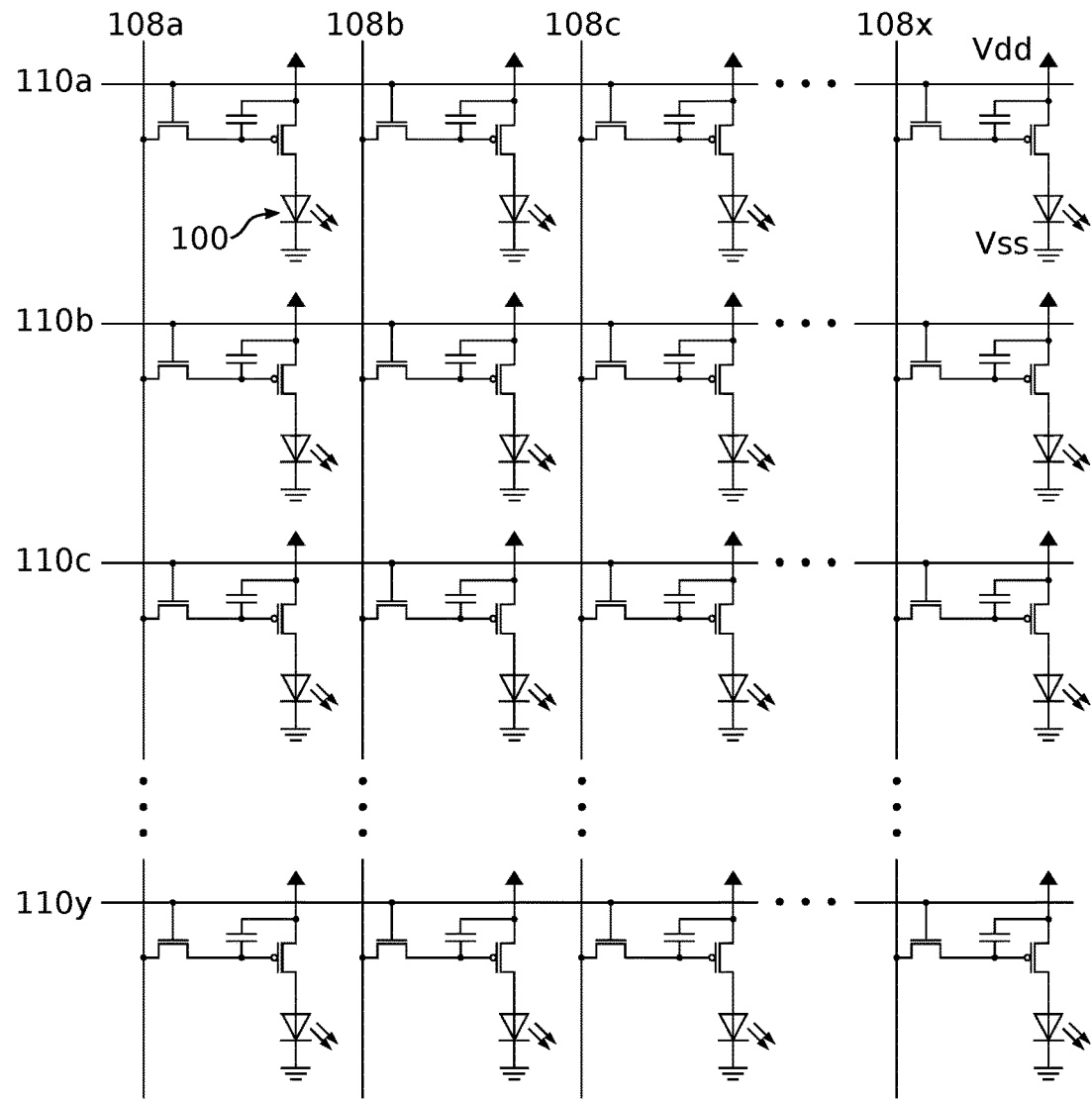
FIG. 2 is a schematic view of an emission substrate enabled with a first plurality of active matrix (AM) drive circuits (prior art).
Figure 3A:
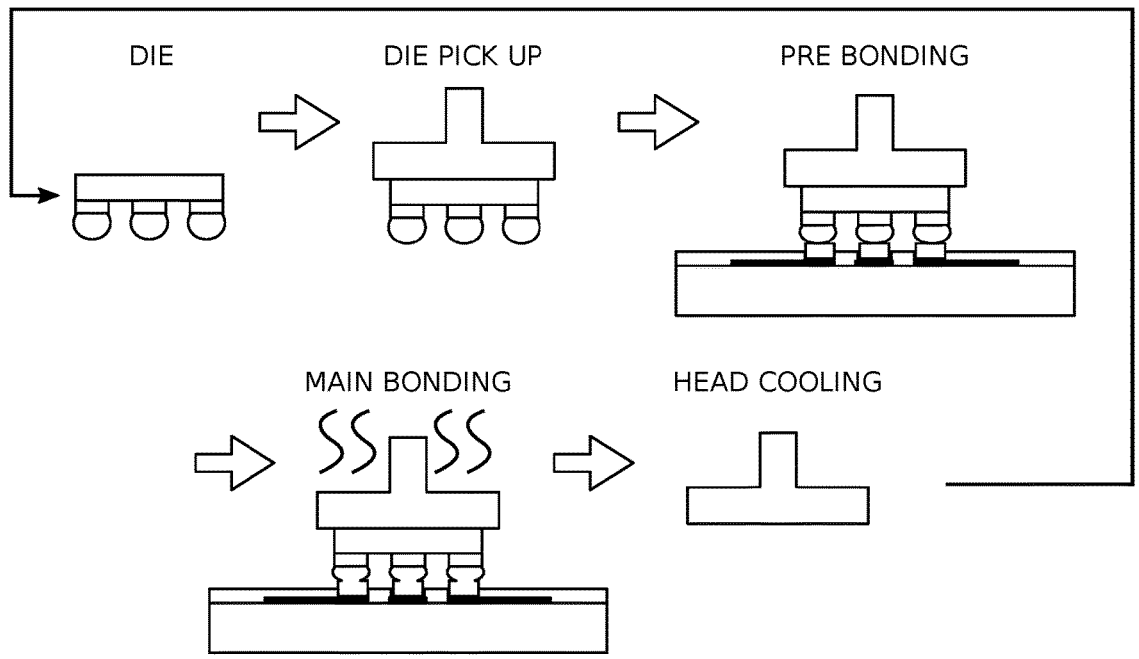
FIGS. 3A and 3B illustrate fabrication steps comparing conventional TCB bonding of FIG. 3A with 2-step gang bonding of FIG. 3B (prior art).
Figure 3B:
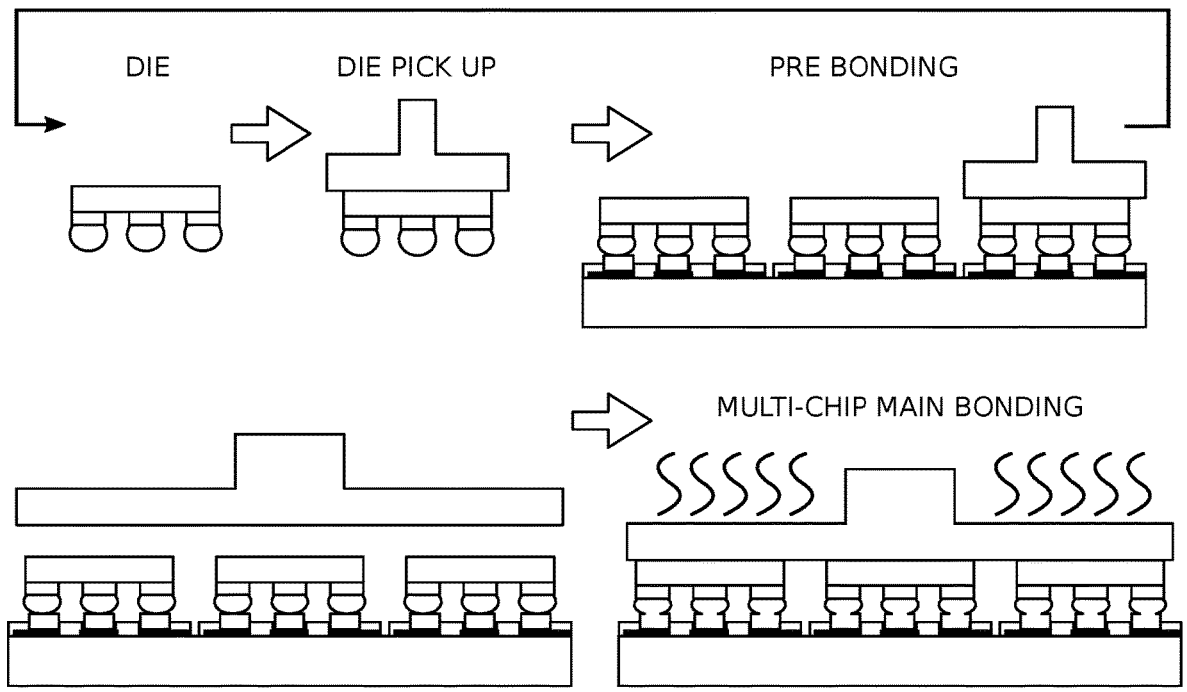
Figure 4:
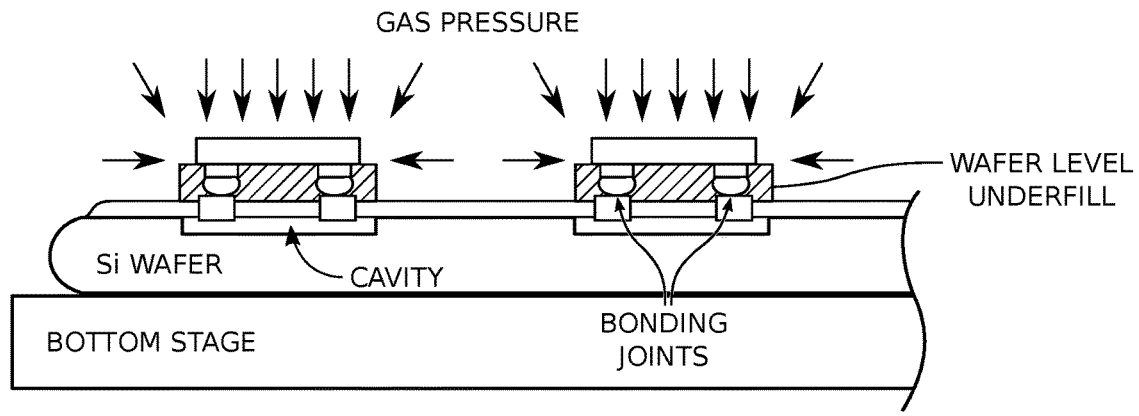
FIG. 4 is a diagram depicting the application of uniform pressure onto chips with various thicknesses using hydrostatic pressure (prior art).
Figure 5A:
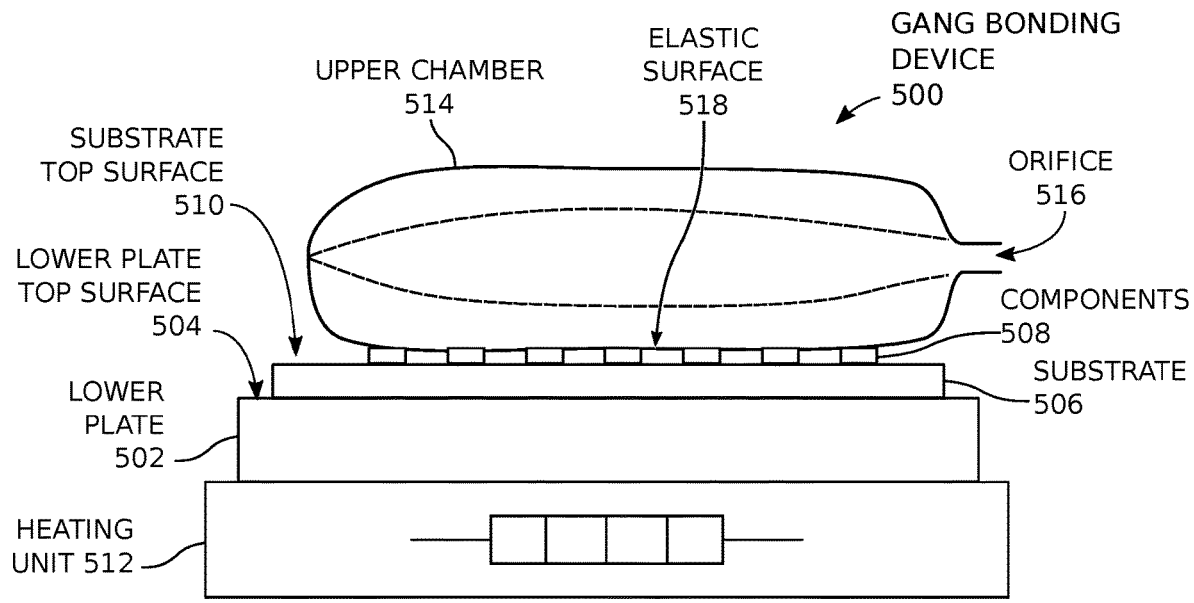
FIGS. 5A and 5B are a partial cross-sectional view of a uniform pressure, electronic component gang bonding device.
Figure 5B:
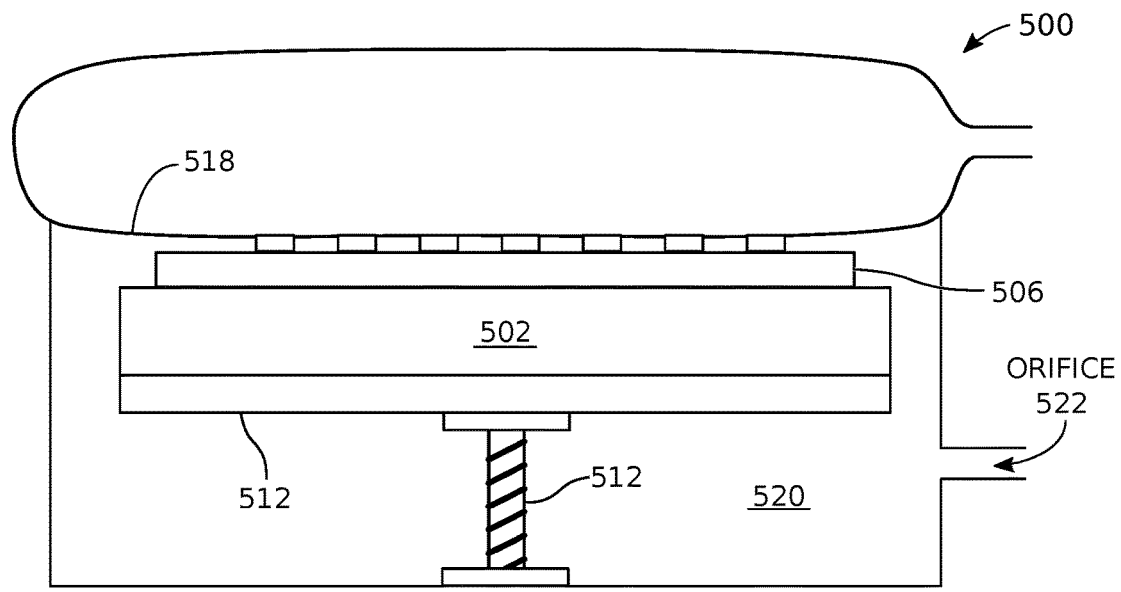

FIGS. 5A and 5B are a partial cross-sectional view of a uniform pressure, electronic component gang bonding device. The gang bonding device 500 comprises a lower plate 502 having a top surface 504 to accept a substrate 506. The substrate 506 may be a printed circuit board (PCB), glass, or a silicon (Si) integrated circuit (IC). PCB substrates are used for conventional electronic package, while a glass substrate may be used for a mini-light emitting diode (mLED) or a micro-light emitting diode (μLED) array or display, and a Si IC wafer may be used for a 3D IC package. A plurality of components 508 overlies the substrate top surface 510. The components 508 may be same or different type devices. A heating unit 512 typically underlies the lower plate top surface 504. However, the bonding device is not limited to any particular means of heating the substrate 506. An expandable upper chamber 514 comprises an orifice 516 to accept and supply a pressurized upper chamber medium. An elastic surface 518 overlies the lower plate top surface 504, deformable in response to the pressurized medium. The dotted lines indicate the position of the elastic surface prior to the creation of a positive upper chamber pressure differential. The upper chamber medium may be either a gas or a liquid.

The elastic surface 518 deforms in a direction towards the lower plate top surface 504 in response to an increase in upper chamber medium pressure. In one aspect as shown, the upper chamber 514 is enabled as an elastic sealed "bag", in which case all the surfaces are elastic and they expand in response to a positive upper chamber pressure differential. However, the lower surface of the upper chamber bag may deform differently that the other bag surfaces. For example, the upper chamber bag upper surface may be made of a stiffer material that does not expand, or that expands less that the lower surface. Typically, the elastic surface 518 is an elastomer material having a Young's modulus in the range of 40 to 1000 kilo-Pascal (kPA). In one aspect, the elastic surface 518 is deformable in a range between 0.05 millimeters (mm) and 20 mm, in response to the upper chamber pressurized medium. It is also typical that the elastic surface 518 is deformable in response to a pressure differential in a range of 0.5 atmospheres (atm) and 10 atm.

Also shown in FIG. 5A, the lower plate 502 occupies an environment with an ambient atmospheric pressure, and the elastic surface 518 deforms (expands) in a direction towards the lower plate top surface in response to an upper chamber medium pressure greater than the ambient atmospheric pressure. That is, the substrate is not placed in a controlled pressure environment.

The gang bonding device of FIG. 5B depicts an ambient control lower chamber 520 comprising, in part, a seal formed from the upper chamber elastic surface and an orifice 522 accepting and supplying a lower chamber gas medium. The lower plate 502 occupies the ambient control lower chamber 520. Otherwise, the lower chamber 520 is an environmental control lower chamber, which includes the gas medium orifice 522, but the environmental control lower chamber is not sealed, leaving the lower plate exposed to the surrounding ambient atmospheric pressure, which is typically 1 atm. In either case, the elastic surface 518 deforms in a direction towards the lower plate top surface 504 in response to an upper chamber medium pressure greater than the lower chamber gas medium pressure. The lower chamber gas medium may be a vacuum, partial vacuum, ambient air, an inert gas, a forming gas, formic acid, and combinations thereof. FIG. 5B also depicts a coarse positioning mechanism 524 for changing the (vertical) distance between the lower plate 502 and the elastic surface 518. A coarse positioning mechanism can also be used in the gang bonding device variations depicted in FIGS. 5A, 6A, 6B, and 11.

Figure 6A:
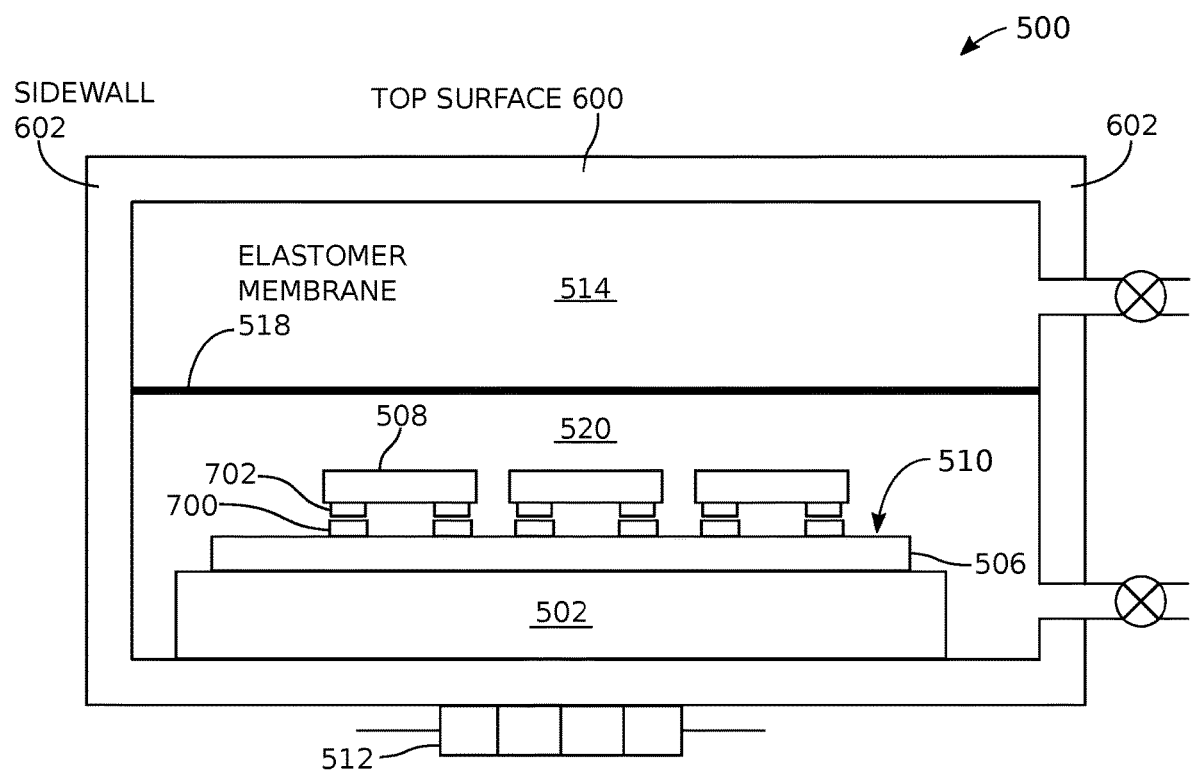
FIGS. 6A and 6B are partial cross-sectional views depicting variations in the gang bonding device.
Figure 6B:
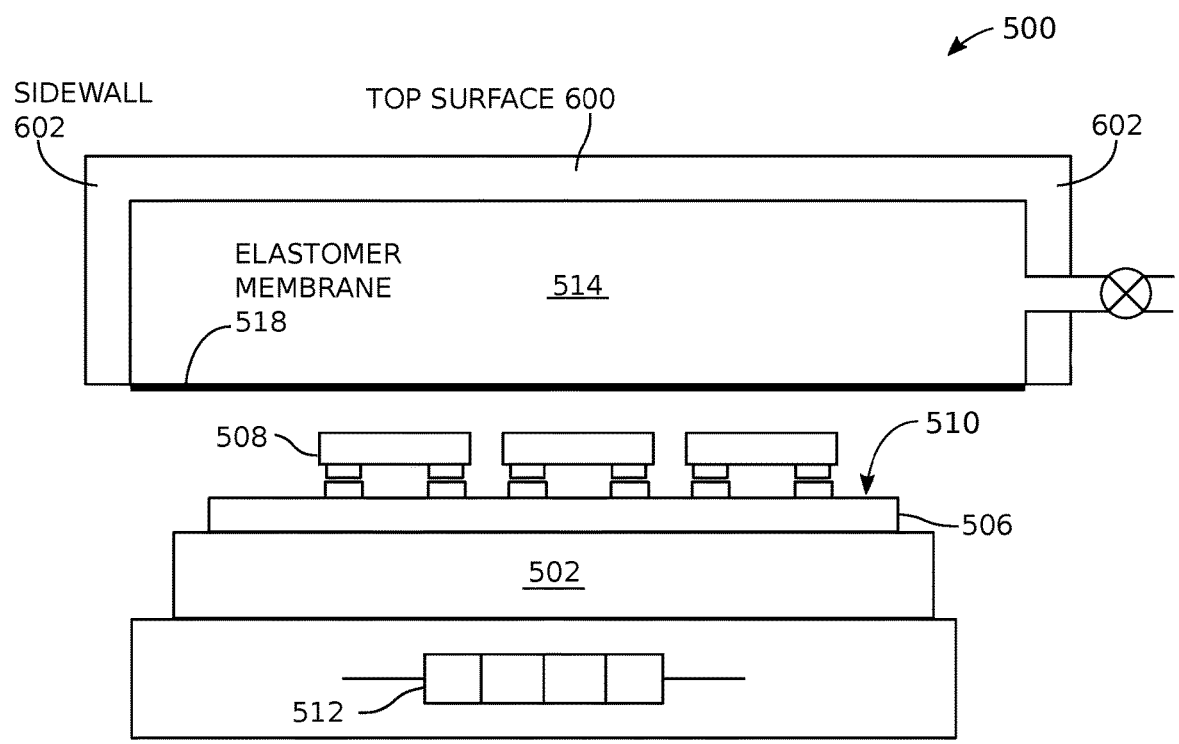

FIGS. 6A and 6B are partial cross-sectional views depicting variations in the gang bonding device. In both figures the expandable upper chamber 514 further comprises a rigid top surface 600 overlying the elastic surface 518. Rigid sidewalls 602 connect the rigid top surface 600 to the elastic surface 518. Thus, in this case the elastic surface 518 is a film or membrane forming a seal along the bottom surface of the upper chamber 514. In FIG. 6A the lower plate 502 occupies an ambient control or environmental control lower chamber, as in FIG. 5B. In FIG. 6B, or in the case of the environmental control lower chamber of FIG. 6A, the lower plate 502 is simply located in an atmosphere of ambient air, inert gas, forming gas, formic acid, or a combination of these elements, with an ambient pressure (i.e., not sealed in a pressure controlled chamber).

Figure 7A:
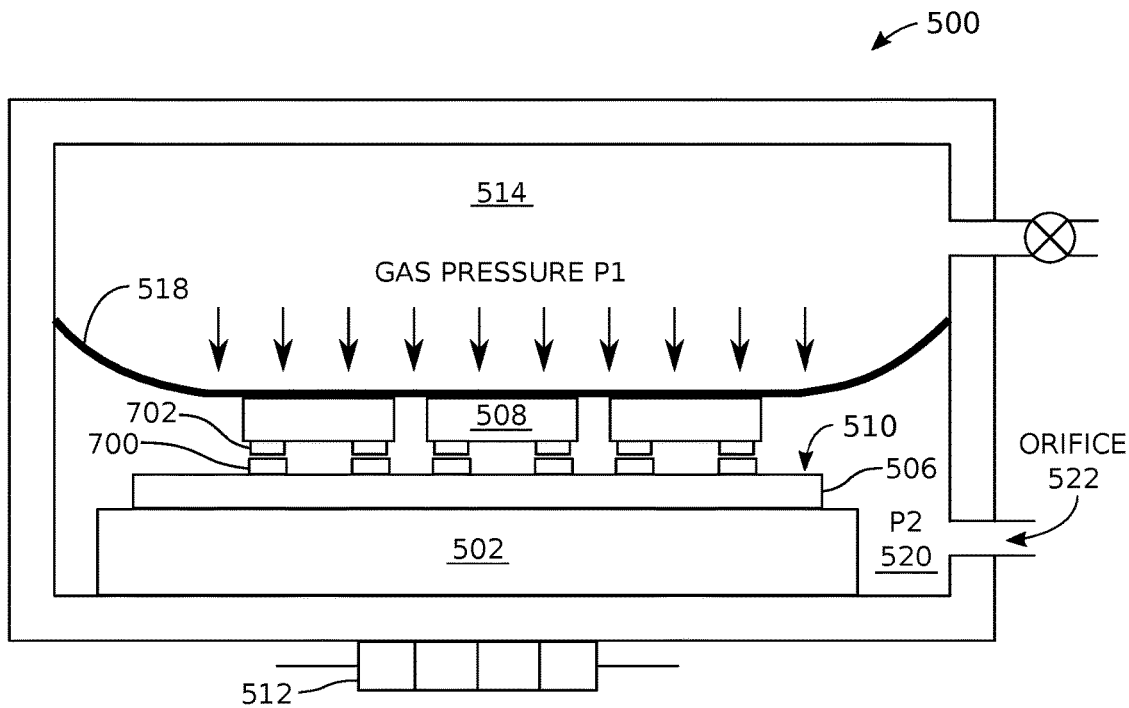
FIGS. 7A and 7B are partial cross-section views of the gang bonding device after the creation of a positive upper chamber medium pressure differential.
Figure 7B:
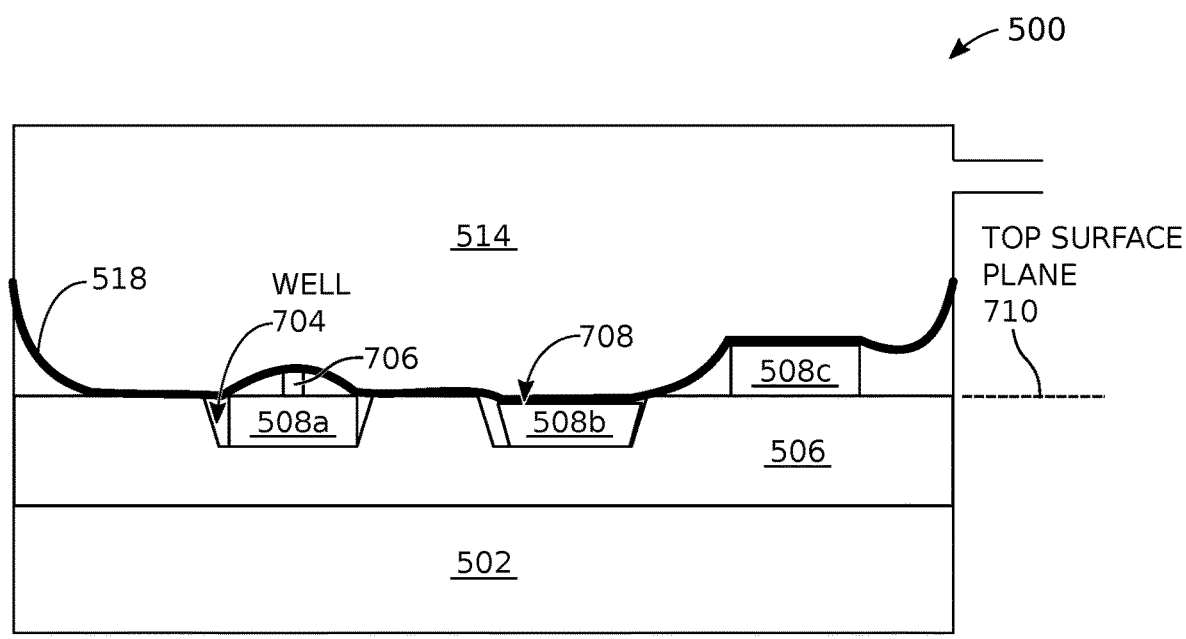

FIGS. 7A and 7B are partial cross-section views of the gang bonding device after the creation of a positive upper chamber medium pressure differential. In FIG. 7A the substrate 506 overlies the lower plate top surface 504, and it has a top surface 510 with a plurality of electrical interfaces 700, which are more clearly seen in FIG. 6A. In this case, components 508 may be semiconductor devices overlying the substrate top surface 510, with each semiconductor device having electrical contacts 702 overlying corresponding electrical interfaces 700 on the substrate top surface 510. The semiconductor device electrical contacts 702 are bonded, typically solder bonded, to the substrate electrical interfaces 700 in response to heating the substrate 506 and the elastic surface 518 compressing the semiconductor devices 508 into the substrate top surface 510. The elastic surface 518 acts to create a uniform pressure on the plurality of semiconductor devices 508. In other aspects, device 500 can aid in the adhesive bonding of components to substrates, without the use of solder or without making electrical connections.

FIG. 7B depicts a substrate 506 such as might be used in the fluidic assembly of a micro-LED display. In this case the substrate top surface 510 includes wells 704, typically formed by etching the substrate top surface. LED component 508a occupies a first well, and includes a post or navigation keel 706 extending the LED above the plane 710 of the substrate top surface 510. LED component 508b occupies a second well and its upward facing surface 708 does not extend as far as the substrate top surface plane 710, so that the combination of the well and LED 508b create a concavity. Component 508c is formed on the substrate top surface. The elastic surface 518 is able to create a uniform pressure on all three components 508a, 508b, and 508c, despite the differences in profile height.

As shown in FIGS. 6A and 7A, the gang bonding tool 500 is composed of two chambers 514 and 520, and an elastomer membrane 518 separating the chambers. The lower chamber 520 is heated and the atmosphere can be controlled to facilitate the bonding process. The upper chamber 514 is used to introduce a gas or liquid pressure medium to deform the elastomer membrane. The product substrate 506 typically contains electrical wiring and bonding pads 700 with the chips 508 to be bonded already assembled, and it is placed in the lower chamber on a heated chuck 512. In FIGS. 6A and 7A, the heated chuck 512 is shown as located outside the lower chamber, but in some cases the heated chuck may be situated inside the lower chamber, as shown in FIG. 5B for example. In FIG. 6A, the chip electrodes 702 and substrate bonding pads 700 are shown purposely separated by a gap indicating that a bond has not yet been formed even though the two electrodes may be in physical contact. In some cases, solder paste may be placed between chip electrodes and substrate bonding pads.

Figure 11:
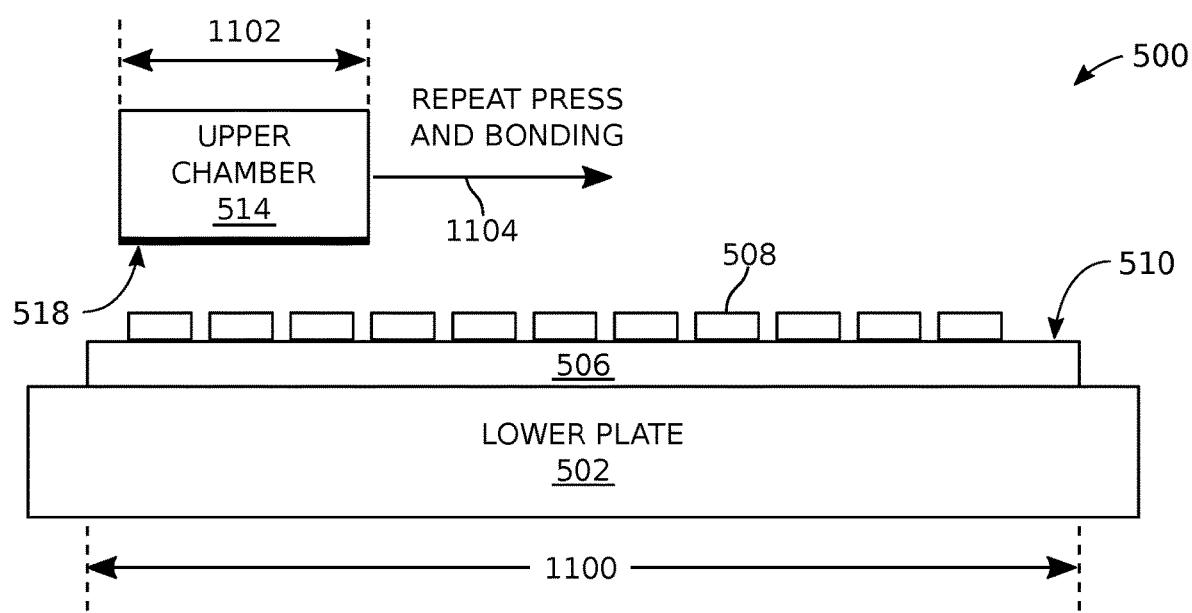
FIG. 11 is a partial cross-sectional view of a gang bonding device incorporating a traversing mechanism.

FIG. 11 is a partial cross-sectional view of a gang bonding device incorporating a traversing mechanism. In this aspect the elastic surface 518 has a first surface area and the substrate top surface 510 has a second surface area greater than the first surface area. In this two-dimensional figure, the larger area of the substrate top surface 510 is represented by a greater length 1100 than the length 1102 of the elastic surface 518. The bonding device 500 further comprises a traversing mechanism, represented by arrow 1104, for changing the relative overlying orientation of the elastic surface 518 with respect to the substrate top surface 510. The traversing mechanism 1104 can be enabled by moving either the upper chamber 514 or lower plate 502, or both. Although not explicitly shown, the lower plate may occupy an environmental or ambient control lower chamber as described above.

An exemplary bonding process proceeds as follows. Please note that these steps may occur simultaneously or sequentially, and the step number does not necessarily imply the process sequence:

1. Ambient control. In some aspects, process bonding in an oxygen free environment is preferred, so the ambient environment can be inert gas, vacuum, or even a reducing environment. The common inert gases include argon (Ar) and nitrogen ($N_2$). The reducing environment can be a forming gas ($H_2+N_2$ mixture), formic acid, or similar mixture. The pressure of lower chamber is denoted as $P_2$ in FIG. 7A.
2. Pump pressure medium into top chamber to pressure $P_1$. When the upper chamber pressure $P_1$ is higher than the bottom chamber pressure $P_2$, the elastomer membrane 518 is deformed pushing downward. At some pressure difference, the membrane 518 reaches the chips 508 and exerts a downward force to reduce the gap between the chip electrode 702 and substrate bonding pad 700. This mechanical contact between electrode and pad can also disrupt any surface oxides that may impede bonding.
3. Apply heat. Rapidly ramp up the heater to reach the eutectic bonding or solder bonding temperature so the chip electrodes 702 and the substrate bonding pads 700 begin to interact and fuse together.
4. Hold. Maintain temperature and pressure for a period of time to let chip electrodes 702 and the substrate bonding pads 700 form the desired intermetallic compound (IMC).
5. Cool. After forming the IMC layer that ensures strong bonding between chips and substrate, remove the pressure and cool down the system so the product substrate can be removed.

Initially, when the elastomer touches to the chip surface, the net force applied to the chip is the pressure difference ($P_1-P_2$) times the chip surface area. When the chip electrode and substrate pad are in intimate contact, the force applied to the chip is higher than the initial condition. More importantly, the magnitude of the pressure applied to the chips is the same regardless of their thicknesses. Note that the force is pressure times the chip surface area, so the magnitude of force applied to the chips is the same if the chip area is the same.

$P_1$ can be in the range of 100-1000 kPA and $P_2$ in the range of 0.001-100 kPA.

The elastomer material can be polydimethylsiloxane PDMS with Young's modulus 40-1000 kPA.

The elastomer material may have a thickness of 0.1-10 mm.

The system can have an upper chamber only, with the lower chamber at regular atmospheric conditions (FIGS. 5A, 6B, and 11), or with the lower chamber having environmental (gas medium) control, or with the lower chamber having ambient (gas medium and pressure) control (FIGS. 5B and 6A).

For a quick analysis of the force exerted on devices during bonding using the elastomer medium, one can assume that the deformation of the elastomer is small and the elastic material exhibits a linear elasticity that can be described by Hooke's law as a linear relationship between the stress and strain. Although Hooke's law only holds for materials under certain loading conditions, it is sufficient to analyze the pressure on devices during bonding. Hooke's law can be stated as a relationship between tensile (or compression) force F and corresponding extension displacement x, $$F = kx,$$

where k is a constant known as the rate or spring constant. Furthermore, Hooke's law can also be stated as a relationship between stress σ and strain ε

$$\sigma = E\varepsilon,$$

where E is the elastic modulus or Young's modulus. Furthermore, strain is dimensionless, indicating the fractional change in length, $$\varepsilon = \Delta L/L.$$

so the stress σ (for pressure, P) can be presented as $$\sigma = F/A.$$

Figure 8:
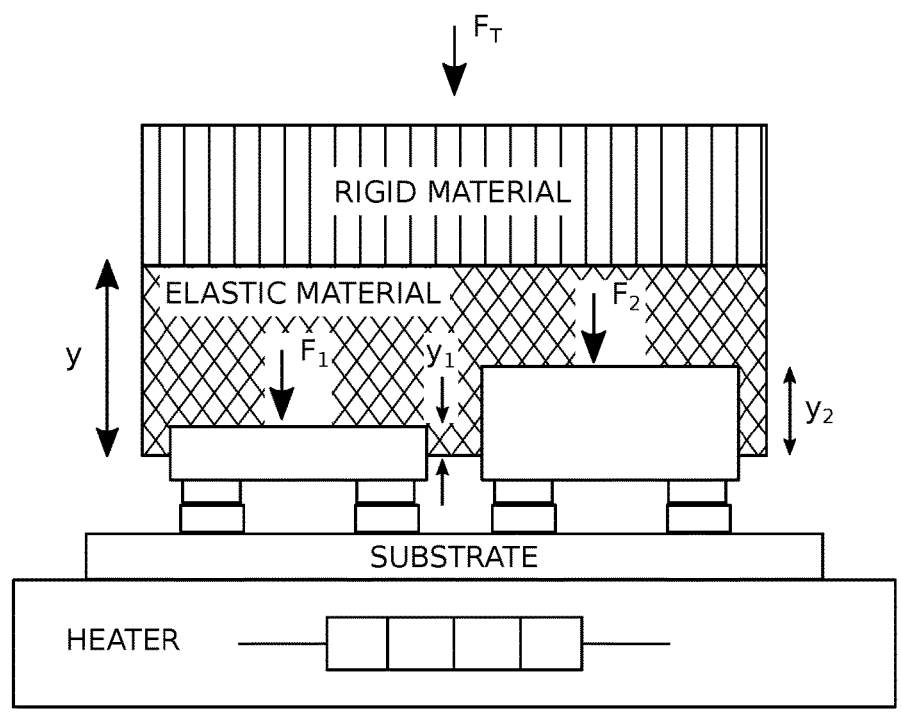
FIG. 8 is a force diagram depicting a conventional gang bonding apparatus (prior art).

FIG. 8 is a force diagram depicting a conventional gang bonding apparatus (prior art). The forces exerted on different chips in the conventional gang bonding apparatus are shown. The thickness difference between Chip 1 and Chip 2 is exaggerated for a clearer description. The forces on Chip 1 and Chip 2 are:

$$F_1 = A_1\sigma_1 = A_1 E\varepsilon_1 = A_1 E(y_1/y)$$

$$F_2 = A_2\sigma_2 = A_2 E\varepsilon_2 = A_2 E(y_2/y)$$

The stresses on Chip 1 and Chip2 are linearly proportional to the strain occurring in the elastic material directly above the chips. For this gang bonding set up, it can be seen that uniform stress is difficult to apply on all chips. The total force on the bonding head (FT) equals to the total forces applied to the chips ($F_1+F_2+\ldots$).

Figure 9:
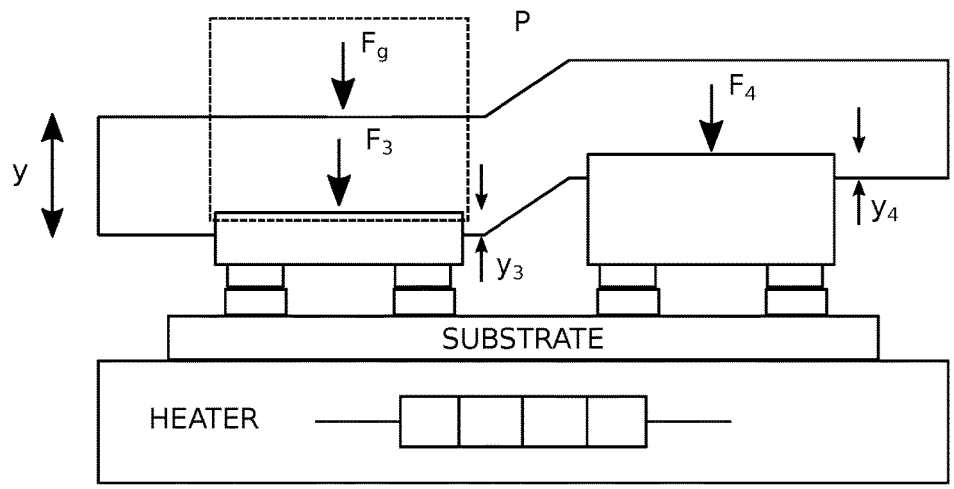
FIG. 9 is a force diagram for the gang bonding device described herein.

FIG. 9 is a force diagram for the gang bonding device described herein. Focusing on the dotted-line box in the figure, $F_g$ (the gas force applied to the membrane with an area equal to the chip size) equals $F_3$ (the force applied to the chip by the membrane), so the system is in balance. If $F_g$ is different from $F_3$, the elastomer deforms until the forces are in balance. Therefore, $$F_g = F_3 = A_3\sigma_3 = A_3 E\varepsilon_3 = A_3 E(y_3/y)$$

Furthermore, Fg is the force applied on Chip 3 and it equals the gas pressure times the chip area, i.e., $$F_g = PA_3 = A_3\sigma_3 \rightarrow P = \sigma_3$$

Similarly, $$F_g = PA_4 = A_4\sigma_4 \rightarrow P = \sigma_3 = \sigma_4$$

From this analysis, it is clear that the stress applied to each chip is the same regardless of the chip thickness. Alternatively stated, if two chips have the same surface area, then the force applied to each chip is the same regardless of the chip thicknesses. Again, the gang bonding device described herein provides a way to apply uniform stress (or pressure) on chips for group bonding or gang bonding applications.

In summary, the gang bonding apparatus provides a uniform pressure onto many chips regardless of the chip thickness. The apparatus uses a chamber with one surface made of elastomer membrane. A medium pressure in the chamber is uniformly applying to the elastomer membrane, and the elastomer membrane applies uniform pressure onto chips that eventually bond to substrate. A heated surface supports the product substrate. As noted above, the system can have an upper chamber only, with the lower part being an ambient gas and/or pressure environment. Alternatively, a lower chamber may be used to control the environment (gas medium) and pressure.

Figure 10:
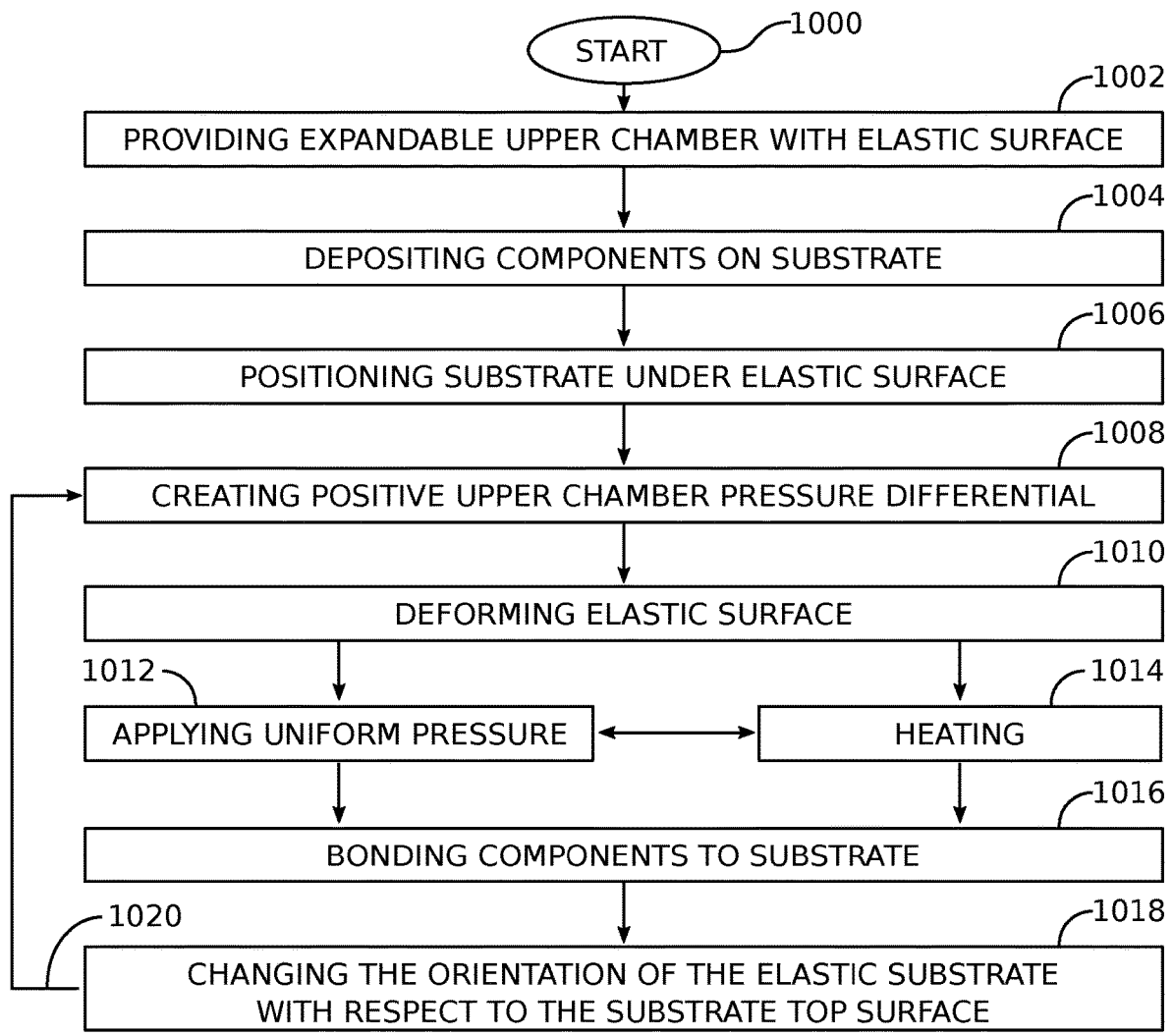
FIG. 10 is a flowchart illustrating a method for uniform pressure gang bonding.

FIG. 10 is a flowchart illustrating a method for uniform pressure gang bonding. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps and corresponds to the device descriptions presented above. The method starts at Step 1000.

Step 1002 provides a lower plate and an expandable upper chamber with an elastic surface. Typically, the elastic surface is made from an elastomer material having a Young's modulus in a range of 40 to 1000 kPA. Step 1004 deposits (assembles) a plurality of components overlying a substrate top surface. Step 1006 positions the substrate overlying the lower plate, with the top surface underlying and adjacent to the elastic surface. Step 1008 creates a positive upper chamber medium pressure differential in the expandable upper chamber. Typically, Step 1008 creates a pressure differential in a range of 0.5 atm and 10 atm. The upper chamber medium may be either a gas or a liquid. Step 1010 deforms the elastic surface. Typically, Step 1010 deforms the elastic surface in a range between 0.05 mm and 20 mm, in response to the positive upper chamber medium pressure differential. In response to deforming the elastic surface, Step 1012 applies a uniform pressure on the plurality of components.

In some aspects, simultaneous with the application of the uniform pressure in Step 1012, Step 1014 heats the substrate. In response to the uniform pressure and heat, Step 1016 bonds the components to the substrate top surface. In one aspect, depositing the plurality of components overlying the substrate top surface in Step 1004 includes depositing semiconductor devices with electrical contacts overlying corresponding electrical interfaces on the substrate top surface. Then, bonding the components to the substrate top surface in Step 1016 includes solder bonding the semiconductor device electrical contacts to the substrate electrical interfaces.

In one variation, positioning the substrate top surface underlying and adjacent to the elastic surface in Step 1006 includes the substrate top surface occupying an environment with an ambient atmospheric pressure or an environmental control chamber where the type of gas (atmosphere) medium is controlled. Then, creating the positive upper chamber medium pressure differential in the expandable upper chamber in Step 1008 includes creating an upper chamber pressure greater than the ambient atmospheric pressure, and deforming the elastic surface in Step 1010 includes deforming the elastic surface in a direction towards the substrate top surface. In the case of an environmental control lower chamber being used, the type of gas medium being supplied in Step 1006 is ambient air, an inert gas, a forming gas, formic acid, or a combination of these elements. In another variation, positioning the substrate top surface underlying and adjacent to the elastic surface in Step 1006 includes the substrate top surface occupying an ambient control lower chamber, with a seal formed, in part, by the elastic surface of the expandable upper chamber. Creating the positive upper chamber medium pressure differential in the expandable upper chamber in Step 1008 then includes creating an upper chamber pressure in the expandable upper chamber greater than the pressure in the ambient control lower chamber, and deforming the elastic surface in Step 1010 includes deforming the elastic surface in a direction towards the substrate top surface. The pressure in the ambient control lower chamber can be created using one of the following mediums: a vacuum, a partial vacuum, ambient air, an inert gas, a forming gas, formic acid, and combinations thereof. The gases may be used for the purposes of etching or prevention oxidation for example.

In one aspect, depositing the plurality of components overlying the substrate top surface in Step 1002 includes depositing first components having a first profile height and depositing second components having a second profile height, different than the first profile height. The differences in profile heights may be the result of different component thicknesses or topologies (e.g., navigation keels), a non-planar substrate top surface, or a combination of these factors. It should also be noted that the substrate surface may include wells, with components occupying the wells having a top surface beneath the level of the substrate surface surrounding the well. Then, applying the uniform pressure on the plurality of components in Step 1012 includes applying a uniform first pressure on both the first and second components. More explicitly, applying the uniform first pressure on the first and second components may be described as applying a pressure with difference of less than or equal to 5 kPA for a difference in profile height of up to 100 microns. For example, at a bonding pressure of about 3 atm, the pressure difference of 5 kPA represents a pressure non-uniformity of less than 2%. A 5 kPA pressure difference at 10 atm would yield a non-uniformity of less than 0.5%.

In one aspect, Step 1002 supplies an elastic surface having a first surface area and Step 1004 deposits components over a substrate top surface having a second surface area greater than the first surface area. Then, the method further comprises Step 1018 subsequent to bonding a first group of components to the substrate top surface in Step 1016. Step 1018 changes the relative overlying orientation of the elastic surface with respect to the substrate top surface, and Step 1020 (represented by the connecting arrow in the figure), repeats the steps required for bonding a second group of components (Steps 1008 through 1016).

A uniform pressure gang bonding device and associated fabrication method have been provided. Examples of particular materials, dimensions, profiles, and circuit layouts have been presented to illustrate the invention. Although emissive elements, particularly LEDs, have been presented, the methods described herein are also applicable to other devices such as semiconductor ICs, photodiodes, thermistors, pressure sensors, piezoelectric devices, and passive devices. Other variations and embodiments of the invention will occur to those skilled in the art.

We claim:

1. A uniform pressure gang bonding method comprising:
providing a lower plate and an expandable upper chamber with an elastic surface;
depositing a plurality of components overlying a substrate top surface;
positioning the substrate overlying the lower plate, with the substrate top surface underlying and adjacent to the elastic surface and occupying an environmental control lower chamber, with a seal formed by the elastic surface of the expandable upper chamber;
creating a positive upper chamber medium pressure differential in the expandable upper chamber greater than the pressure in the environmental control lower chamber;
temporarily deforming the elastic surface in a direction towards the substrate top surface; and,
in response to temporarily deforming the elastic surface, applying a uniform pressure on the plurality of components;
in response to the uniform pressure, bonding the components to the substrate top surface;
decreasing the upper chamber medium pressure differential in the expandable upper chamber; and,
separating the elastic surface from the components on the substrate top surface.

2. The method of claim 1 further comprising:
simultaneous with applying the uniform pressure, heating the substrate; and,
wherein bonding the components to the substrate top surface includes bonding in response to the uniform pressure and heat.

3. The method of claim 2 wherein depositing the plurality of components overlying the substrate top surface includes depositing semiconductor devices with electrical contacts overlying corresponding electrical interfaces on the substrate top surface; and,
wherein bonding the components to the substrate top surface includes solder bonding the semiconductor device electrical contacts to the substrate electrical interfaces.

4. The method of claim 1 wherein positioning the substrate top surface underlying and adjacent to the elastic surface includes the substrate top surface-occupying an environmental control lower chamber with an atmospheric pressure controlled by a type of gas medium selected from the group consisting of ambient air, an inert gas, a forming gas, formic acid, and combinations thereof.

5. The method of claim 1 wherein creating the positive pressure in the expandable upper chamber greater than the pressure in the environmental control lower chamber includes creating a pressure in the environmental control lower chamber using a medium selected from the group consisting of a vacuum, a partial vacuum, ambient air, an inert gas, a forming gas, formic acid, and combinations thereof.

6. The method of claim 1 wherein creating the positive upper chamber medium pressure differential in the expandable upper chamber includes creating an upper chamber pressure using a medium selected from the group consisting of a gas or a liquid.

7. The method of claim 1 wherein providing the expandable upper chamber with an elastic surface includes providing the elastic surface made from an elastomer material having a room-temperature Young's modulus in a range of 40 to 1000 kilo-Pascal (kPA).

8. The method of claim 1 wherein depositing the plurality of components overlying the substrate top surface includes depositing first components having a first profile height and depositing second components having a second profile height, different than the first profile height; and,
wherein applying the uniform pressure on the plurality of components includes applying a uniform first pressure on both the first and second components.

9. The method of claim 8 wherein applying the uniform first pressure on the first and second components includes applying a pressure with difference of less than or equal to 5 kPA for a difference in profile height of up to 100 microns.

10. The method of claim 1 wherein deforming the elastic surface includes deforming the elastic surface in a range between 0.05 millimeters (mm) and 20 mm, in response to the positive upper chamber medium pressure differential.

11. The method of claim 1 wherein creating the positive upper chamber medium pressure differential includes creating a pressure differential in a range of 0.5 atmospheres (atm) and 10 atm.

12. The method of claim 2 wherein providing the elastic surface includes supplying the elastic surface having a first surface area;
wherein depositing the plurality of components overlying the substrate top surface includes depositing components over a substrate top surface having a second surface area greater than the first surface area;
the method further comprising:
subsequent to bonding a first group of components to the substrate top surface, changing the relative overlying orientation of the elastic surface with respect to the substrate top surface; and,
repeating the steps required for bonding a second group of components.

13. The method of claim 2 further comprising:
subsequent to temporarily deforming the elastic surface a first time and bonding a first group of components to a first substrate top surface, depositing a second group of components overlying a second substrate top surface;
positioning the second substrate overlying the lower plate, with the second substrate top surface underlying and adjacent to the elastic surface;
creating a positive upper chamber medium pressure differential in the expandable upper chamber;
temporarily deforming the elastic surface a second time; and,
in response to deforming the elastic surface the second time, applying a uniform pressure on the second group of components.

14. The method of claim 4 wherein the substrate top surface occupying an environmental control lower chamber includes supplying an environmental control lower chamber atmospheric pressure controlled by a forming gas medium followed by an inert gas medium.

15. A uniform pressure gang bonding method comprising:
providing a lower plate and an expandable upper chamber with an elastic surface;
depositing a plurality of components overlying a substrate top surface;
positioning the substrate overlying the lower plate, with the substrate top surface underlying and adjacent to the elastic surface, and occupying an environmental control lower chamber with a seal formed by the elastic surface of the expandable upper chamber;
creating a positive upper chamber medium pressure differential in the expandable upper chamber greater than the pressure in the environmental control lower chamber;
temporarily deforming the elastic surface in a direction towards the substrate top surface; and,
in response to temporarily deforming the elastic surface, applying a uniform pressure on the plurality of components.

16. The method of claim 15 wherein creating the positive pressure in the expandable upper chamber greater than the pressure in the environmental control lower chamber includes creating a pressure in the environmental control lower chamber using a medium selected from the group consisting of a vacuum, a partial vacuum, ambient air, an inert gas, a forming gas, formic acid, and combinations thereof.

17. A uniform pressure gang bonding method comprising:
providing a lower plate and an expandable upper chamber with an elastic surface;
depositing a plurality of components overlying a substrate top surface;
positioning the substrate overlying the lower plate, with the substrate top surface underlying and adjacent to the elastic surface;
creating a positive upper chamber medium pressure differential in the expandable upper chamber;
temporarily deforming the elastic surface;
in response to temporarily deforming the elastic surface, applying a uniform pressure on the plurality of components;
simultaneous with applying the uniform pressure, heating the substrate;
subsequent to temporarily deforming the elastic surface a first time and bonding a first group of components to a first substrate top surface, depositing a second group of components overlying a second substrate top surface;
positioning the second substrate overlying the lower plate, with the second substrate top surface underlying and adjacent to the elastic surface;
creating a positive upper chamber medium pressure differential in the expandable upper chamber;
temporarily deforming the elastic surface a second time; and,
in response to deforming the elastic surface the second time, applying a uniform pressure on the second group of components.

18. A uniform pressure gang bonding method comprising:
providing a lower plate and an expandable upper chamber with an elastic surface;
depositing a plurality of components overlying a substrate top surface;
positioning the substrate overlying the lower plate, with the substrate top surface underlying and adjacent to the elastic surface, and occupying an environmental control lower chamber with an atmospheric pressure controlled by a type of gas medium selected from the group consisting of ambient air, an inert gas, a forming gas, formic acid, and combinations thereof, and an environmental control lower chamber atmospheric pressure controlled by a forming gas medium followed by an inert gas medium;
creating a positive upper chamber medium pressure differential in the expandable upper chamber;
temporarily deforming the elastic surface in a direction towards the substrate top surface; and,
in response to temporarily deforming the elastic surface, applying a uniform pressure on the plurality of components.

19. A uniform pressure gang bonding method comprising:
providing a lower plate and an expandable upper chamber with an elastic surface;
depositing a plurality of components overlying a substrate top surface;
positioning the substrate overlying the lower plate, with the substrate top surface underlying and adjacent to the elastic surface, and occupying an environmental control lower chamber with a seal formed by the elastic surface of the expandable upper chamber;

creating a positive upper chamber medium pressure differential in the expandable upper chamber greater than the pressure in the environmental control lower chamber;

deforming the elastic surface in a direction towards the substrate top surface;

in response to deforming the elastic surface, applying a uniform pressure on the plurality of components; and, repeating the steps required for bonding a second group of components.

20. A uniform pressure gang bonding method comprising:

providing a lower plate and an expandable upper chamber with an elastic surface;

depositing a plurality of components overlying a substrate top surface;

positioning the substrate overlying the lower plate, with the substrate top surface underlying and adjacent to the elastic surface;

creating a positive upper chamber medium pressure differential in the expandable upper chamber;

in response to temporarily deforming the elastic surface, applying a uniform pressure on the plurality of components;

simultaneous with applying the uniform pressure, heating the substrate;

bonding the components to the substrate top surface in response to the uniform pressure and heat;

decreasing the upper chamber medium pressure differential in the expandable upper chamber;

separating the elastic surface from the components on the substrate top surface;

subsequent to temporarily deforming the elastic surface a first time and bonding a first group of components to a first substrate top surface, depositing a second group of components overlying a second substrate top surface;

positioning the second substrate overlying the lower plate, with the second substrate top surface underlying and adjacent to the elastic surface;

creating a positive upper chamber medium pressure differential in the expandable upper chamber;

temporarily deforming the elastic surface a second time; and, in response to deforming the elastic surface the second time, applying a uniform pressure on the second group of components.

21. A uniform pressure gang bonding method comprising:

providing a lower plate and an expandable upper chamber with an elastic surface;

depositing a plurality of components overlying a substrate top surface;

positioning the substrate overlying the lower plate, with the substrate top surface underlying and adjacent to the elastic surface, occupying an environmental control lower chamber with an atmospheric pressure controlled by a forming gas medium followed by an inert gas medium;

creating a positive upper chamber medium pressure differential in the expandable upper chamber;

temporarily deforming the elastic surface;

in response to temporarily deforming the elastic surface, applying a uniform pressure on the plurality of components;

in response to the uniform pressure, bonding the components to the substrate top surface;

decreasing the upper chamber medium pressure differential in the expandable upper chamber; and, separating the elastic surface from the components on the substrate top surface.

* * * * *